United States Patent
Kubota et al.

(10) Patent No.: US 8,723,391 B2
(45) Date of Patent: May 13, 2014

(54) TUNING FORK VIBRATOR WITH SUPPORT ARMS EXTENDING OBLIQUELY FROM THE BASE

(71) Applicant: Fujitsu Limited, Kawasaki (JP)

(72) Inventors: Hajime Kubota, Kawasaki (JP);
Masayuki Itoh, Kawasaki (JP);
Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/033,910

(22) Filed: Sep. 23, 2013

(65) Prior Publication Data

US 2014/0021829 A1    Jan. 23, 2014

Related U.S. Application Data (63) Continuation of application No. PCT/JP2011/057201, filed on Mar. 24, 2011.

(51) Int. Cl.
*H03H 9/21*  (2006.01)

(52) U.S. Cl.
CPC ........................................ *H03H 9/21* (2013.01)
USPC .................... 310/310; 310/344; 73/504.16

(58) Field of Classification Search
CPC ............ H03H 9/19; H03H 9/21; H03H 9/215
USPC .................................................. 310/370, 344
See application file for complete search history.

(56) References Cited

U.S. PATENT DOCUMENTS

| | | | | |
|---|---|---|---|---|
| 4,969,359 A | * | 11/1990 | Mikkor | 73/514.36 |
| 5,542,297 A | * | 8/1996 | Mizuno et al. | 73/514.36 |
| 5,579,148 A | * | 11/1996 | Nishikawa et al. | 359/214.1 |
| 6,346,765 B1 | * | 2/2002 | Kikuchi et al. | 310/367 |
| 7,639,096 B2 | * | 12/2009 | Ikeda et al. | 331/154 |

(Continued)

FOREIGN PATENT DOCUMENTS

| | | |
|---|---|---|
| JP | 06-112761 A | 4/1994 |
| JP | 10047968 A * | 2/1998 |

(Continued)

OTHER PUBLICATIONS

International Search Report of PCT/JP2011/057201, mailing date of Jun. 7, 2011.

(Continued)

*Primary Examiner* — J. San Martin
(74) *Attorney, Agent, or Firm* — Westerman, Hattori, Daniels & Adrian, LLP (57) ABSTRACT

A tuning fork vibrator includes a package having an internal space having a rectangle column shape; a tuning fork vibration piece including a base, two vibration arms extending in parallel form the base and a first arm and a second arm extending obliquely from the base so as to interpose the two vibration arms, the tuning fork vibration piece having a length from the base to a tip in an extended direction of the two vibration arms which is longer than each side of the bottom surface of the internal space, wherein the tuning fork vibration piece is placed in the internal space with the extended direction set along a diagonal direction of the internal space, and a tip part of the first arm and a tip part of the second arm of the tuning fork vibration piece are fixed to the bottom surface of the internal space.

7 Claims, 10 Drawing Sheets

(56) References Cited

U.S. PATENT DOCUMENTS

| | | | |
|---|---|---|---|
| 8,028,579 B2 * | 10/2011 | Arai et al. | 73/504.12 |
| 2006/0243049 A1 | 11/2006 | Ohta et al. | |
| 2010/0079036 A1 | 4/2010 | Iwai | |
| 2011/0296914 A1 * | 12/2011 | Takahashi et al. | 73/504.15 |
| 2011/0308857 A1 * | 12/2011 | Zapata | 174/88 R |
| 2012/0132002 A1 * | 5/2012 | Dube et al. | 73/504.16 |

FOREIGN PATENT DOCUMENTS

| | | |
|---|---|---|
| JP | 11-023285 A | 1/1999 |
| JP | 2004-297198 A | 10/2004 |
| JP | 2006-308498 A | 11/2006 |
| JP | 2008-022413 A | 1/2008 |
| JP | 2008-199283 A | 8/2008 |
| JP | 2009-118302 A | 5/2009 |
| JP | 2009-206759 A | 9/2009 |
| JP | 2010-087574 A | 4/2010 |
| JP | 2010-103600 A | 5/2010 |
| JP | 2010-243259 A | 10/2010 |

OTHER PUBLICATIONS

Notification of Transmittal of Copies of Translation of the International Preliminary Report on Patentability (Form PCT/IB/338) of International Application No. PCT/JP2011/057201 mailed Oct. 3, 2013 with Forms PCT/IB/373 and PCT/ISA/237.

* cited by examiner

TUNING FORK VIBRATOR WITH SUPPORT ARMS EXTENDING OBLIQUELY FROM THE BASE

CROSS-REFERENCE TO RELATED APPLICATION

This application is a continuation application of International Application PCT/JP2011/057201 filed on Mar. 24, 2011 and designated the U.S., the entire contents of which are incorporated herein by reference.

FIELD

The present invention relates to a tuning fork vibrator.

BACKGROUND

As tuning fork vibrators used for cellular phones, watches, etc., a 3215-size tuning fork vibrator (a tuning fork vibrator whose package size is 3.2 mm×1.5 mm; the same shall applies hereinafter) and a 2012-size tuning fork vibrator are commercially available.

Figure 1:
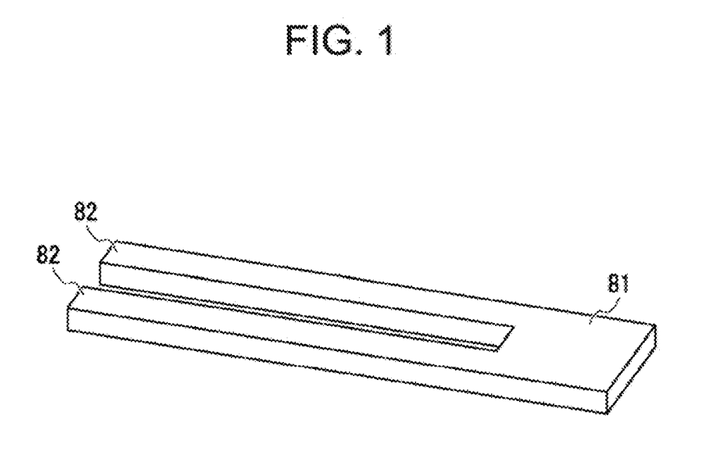
FIG. 1 is a perspective view of an existing tuning fork vibrating piece.

The general 3215-size tuning fork vibrator is configured by placing a tuning fork vibrating piece illustrated in FIG. 1, i.e., a tuning fork vibrating piece having two vibrating arms 82 extended from a base 81, in a package in such a way that its longitudinal direction is aligned with the longitudinal direction of the package.

Figure 2:
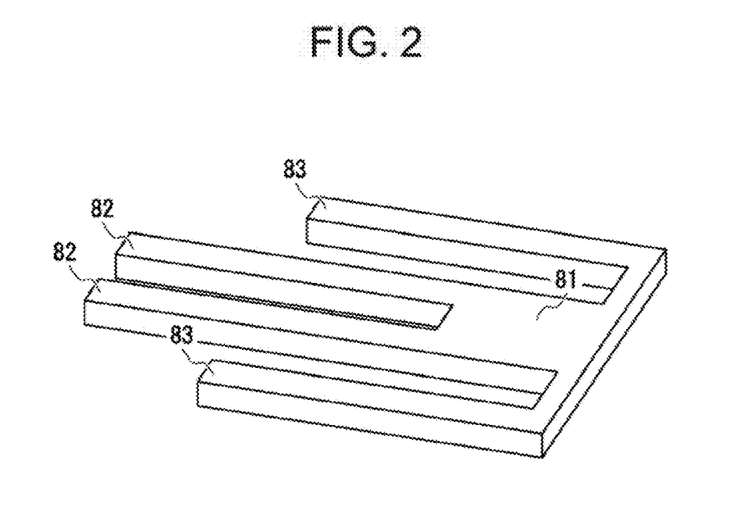
FIG. 2 is a perspective view of an existing tuning fork vibrating piece.

Further, a tuning fork vibrating piece depicted in FIG. 2, i.e., a tuning fork vibrating piece having a fixed arm 83 added to the outside of each vibrating arm 82, is generally used in the 2012-size tuning fork vibrator. Moreover, the 2012-size tuning fork vibrator is configured by housing the tuning fork vibrating piece in the package in such a way that its longitudinal direction is aligned with the longitudinal direction of the package and fixing each fixed arm 83 of the tuning fork vibrating piece to the inner bottom surface of the package.

PRIOR ART REFERENCE

Patent Document 1: Japanese Examined Patent Application Publication No. 11-23285
Patent Document 2: Japanese Examined Patent Application Publication No. 2004-297198
Patent Document 3: Japanese Examined Patent Application Publication No. 2006-308498
Patent Document 4: Japanese Examined Patent Application Publication No. 2008-022413

Most devices in which the tuning fork vibrators are used are small. Therefore, to provide a small tuning fork vibrator has been desired. However, it is difficult to obtain a tuning fork vibrator having short vibrating arms with a high oscillation stability (with a small CI (Crystal Impedance) value).

Figure 3:
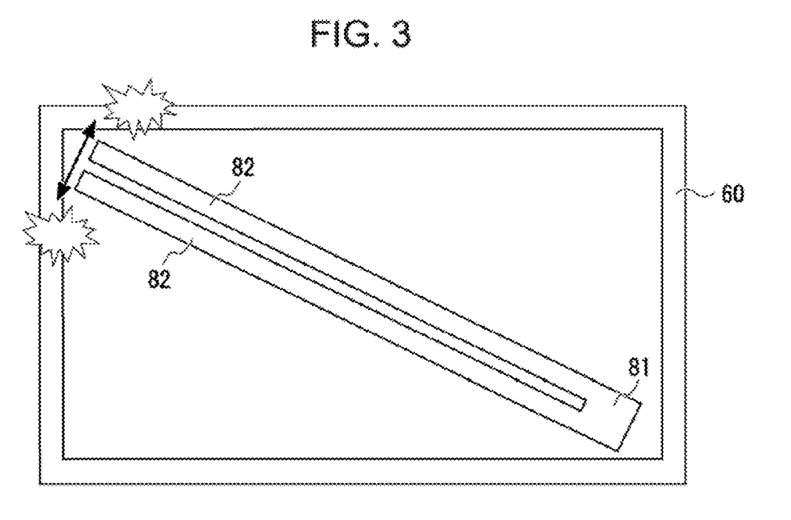
FIG. 3 is an explanatory diagram of a problem that arises if a tuning fork vibrating piece consisting of a base and two vibrating arms is arranged obliquely in a package.

As illustrated in FIG. 3, housing the tuning fork vibrating piece obliquely in the package 60 allows each vibrating arm 82 to be lengthened. However, with this structure, the distance between the tip of each vibrating arm 82 and the inner wall surface of the package 60 is forced to shorten. Further, the tuning fork vibrating piece whose base 81 is fixed to the package can vibrate on the base 81. That is, housing the tuning fork vibrating piece obliquely in the package 60 causes a situation where the tip of each vibrating arm 82 is easy to contact with the inner surface of the package 60 when external force is applied. Consequently, a stable oscillation at a predetermined frequency cannot be obtained just by housing the tuning fork vibrating piece obliquely in the package 60.

SUMMARY

According to an aspect of the embodiments, A tuning fork vibrator includes a package having an internal space having a rectangle column shape; a tuning fork vibration piece including a base, two vibration arms extending in parallel form the base and a first arm and a second arm extending obliquely from the base so as to interpose the two vibration arms, the tuning fork vibration piece having a length from the base to a tip in an extended direction of the two vibration arms which is longer than each side of the bottom surface of the internal space, wherein the tuning fork vibration piece is placed in the internal space with the extended direction set along a diagonal direction of the internal space, and a tip part of the first arm and a tip part of the second arm of the tuning fork vibration piece are fixed to the bottom surface of the internal space.

According to another aspect of the embodiments, a tuning fork vibrator includes a package; and a tuning fork vibrating piece that is placed in the package and includes a base, two vibration arms extending in parallel form the base, and two fixed arms extending obliquely from the base so as to interpose the two vibration arms, wherein each of the two vibration arms of the tuning fork vibrating piece has a U-shape that extends in a specific direction, bents toward a direction separating from a mounting surface of the tuning fork vibrating piece onto the package, and then extends in a direction opposite to the specific direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Four types of tuning fork vibrators (hereinafter be denoted tuning fork vibrators according to a first through forth embodiment) developed by the inventors will hereinafter be described with reference to the drawings.

First Embodiment

Figure 4:
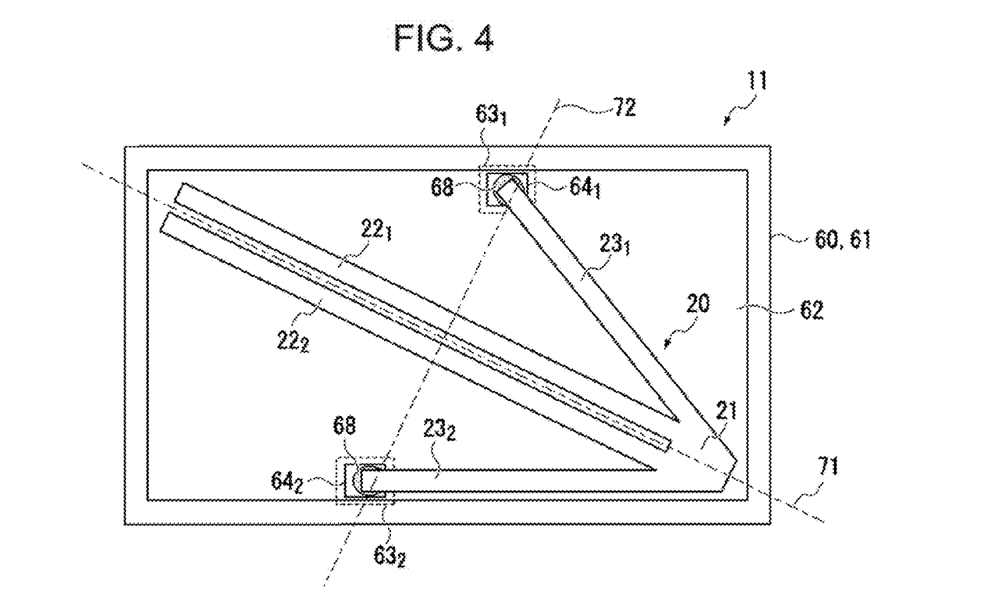
FIG. 4 is a schematic structural view of a tuning fork vibrator according to a first embodiment.

FIG. 4 illustrates a schematic structure of a tuning fork vibrator 11 according to the first embodiment. Note that, in FIG. 4 and each of other FIGS which will be used below, scale of each part has been modified arbitrarily to make each part of the tuning fork vibrator 11 etc. easy to recognize.

As depicted in FIG. 4, the tuning fork vibrator 11 according to the first embodiment is a surface mounting type tuning fork vibrator configured by housing a tuning fork vibrating piece 20 in an internal space 62 of a package 60.

The package 60 is a case of the tuning fork vibrating piece 20, which includes as main components a box-like member 61 and a member (not shown; hereinafter be termed a lid part) that functions as a lid of the box-like member 61

The box-like member 61 of the package 60 has a concave portion that forms a rectangle column-shaped internal space 62 when sealed with the lid part. On the undersurface (under means the depth direction of the paper surface of FIG. 4) of the box-like member 61, provided are a first mounting terminal $63_1$ and a second mounting terminal $63_2$, which are to be connected with a drive circuit for the tuning fork vibrator 11. Further, on the bottom surface of the concave portion of the box-like member 61 (on the bottom surface of the internal space 62 of the package 60), provided are a first installation terminal $64_1$ and a second installation terminal $64_2$ which are electrically connected to the first mounting terminal $63_1$ and the second mounting terminal $63_2$ via a through hole etc., respectively.

The tuning fork vibrating piece 20 is a crystal oscillator manufactured by processing a crystal piece in the same procedure (method) as a general tuning fork vibrating piece.

As depicted in FIG. 4, the tuning fork vibrating piece 20 includes a base 21, and two vibrating arms $22_1$ and $22_2$ extending in parallel from the base 21. Furthermore, the tuning fork vibrating piece 20 includes a first fixed arm $23_1$ and a second fixed arm $23_2$ extending obliquely from the base 21 so as to interpose the two vibrating arms $22_1$ and $22_2$.

Hereinafter, for convenience of explanation, the vibrating arm $22_1$ or the vibrating arm $22_2$ is called the vibrating arm 22, and the extending direction of each vibrating arm 22 is called the front-back direction. Further, a part consisting of the base 21 and the two vibrating arms 22 of the tuning fork vibrating piece 20 is called a body part, and the bottom surface of the internal space 62 of the package is called the mounting surface. Moreover, the first fixed arm $23_1$ or the second fixed arm $23_2$ is called the fixed arm 23, and the first mounting terminal $63_1$ or the like is also called in the same way.

As illustrated in FIG. 4, the tuning fork vibrating piece 20 has a length in the front-back direction larger than the longer side of the mounting surface. Therefore, the tuning fork vibrating piece 20 can be housed within the internal space 62 only in the form where the front-back direction is along the diagonal direction of the mounting surface (in the form where the front-back direction is set almost parallel to the diagonal direction of the mounting surface).

Further, the shape of each fixed arm 23 of the tuning fork vibrating piece 20 is determined so that a plane 72 which passes through the center of gravity of the tuning fork vibrating piece 20 and is perpendicular to the front-back direction crosses the tip part of each fixed arm 23. The shape of each fixed arm 23 is also determined so that the spacing between the tip parts of the fixed arms 23 becomes the largest (so that the tip part of each fixed arm 23 is located near the inner wall of the package 60).

Moreover, the first fixed arm $23_1$ and the second fixed arm $23_2$ has mirror symmetry in relation to a plane 71 that is located at the center of the two vibrating arms 22. The body part also has a plane symmetrical shape with respect to the plane 71. Therefore, the overall shape of the tuning fork vibrating piece 20 has a plane symmetrical shape with respect to the plane 71.

Figure 5:
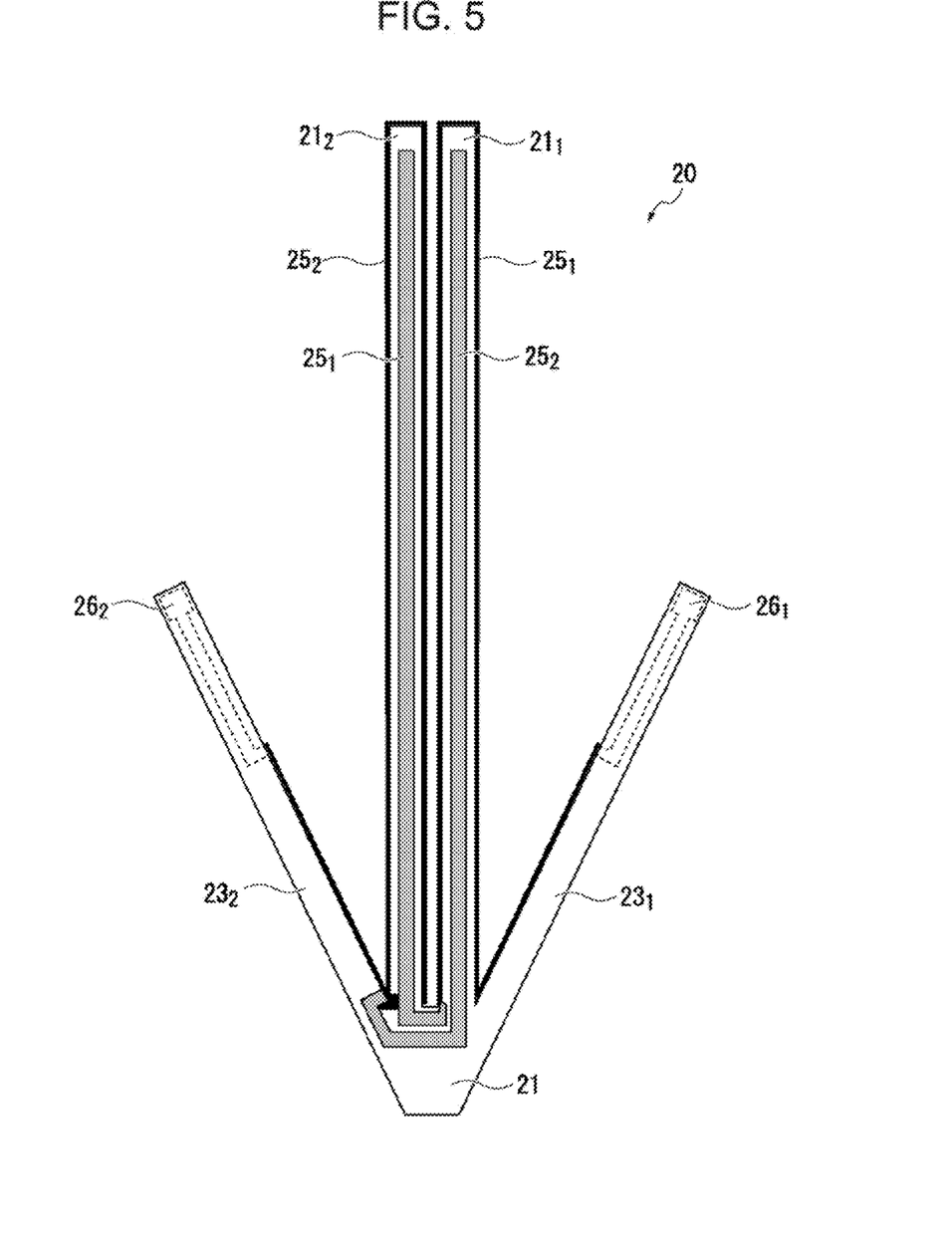
FIG. 5 is a top view of a tuning fork vibrating piece used in the tuning fork vibrator according to the first embodiment.

As illustrated in FIG. 5, two kinds (two systems) of excitation electrodes $25_1$ and $25_2$ are formed on the surfaces of each vibrating arm 22 of the tuning fork vibrating piece 20. Further, the first terminal $26_1$ electrically connected with the excitation electrode $25_1$ is provided on the tip part (hereinafter referred to as the first tip part) of the undersurface of the first fixed arm $23_1$ of the tuning fork vibrating piece 20. Moreover, the second terminal $26_2$ electrically connected with the excitation electrode $25_2$ is provided on the tip part (hereafter referred to as the second tip part) of the undersurface of the second fixed arm $23_2$ of the tuning fork vibrating piece 20.

Figure 6:
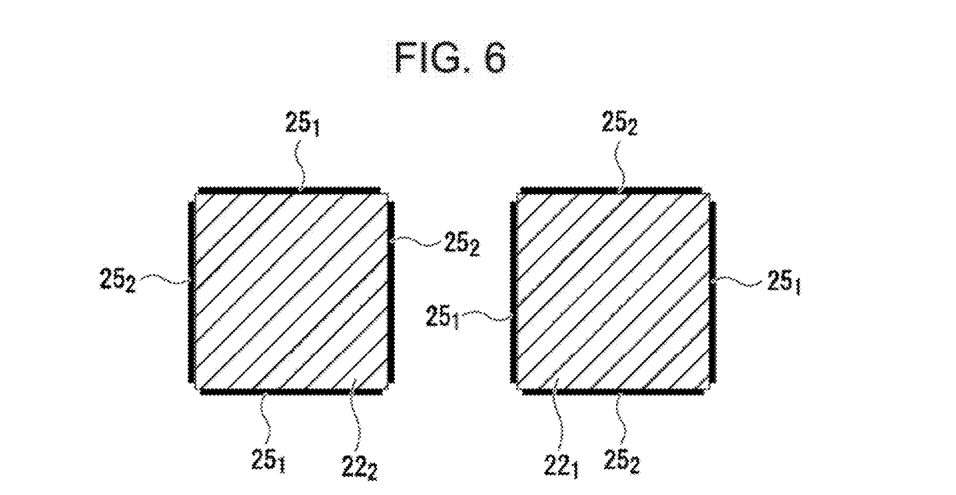
FIG. 6 is a sectional view for explaining a layout example of excitation electrodes.

Note that, as a shape of each excitation electrode 25 ($25_1$, $25_2$), any shape can be used as long as it can make the two vibration arms 22 perform flexion vibration. Therefore, a shape of each excitation electrode (a way to arrange each excitation electrode 25 on each surface of each vibrating arm 22) may be the one schematically illustrated in FIG. 6.

Figure 7:
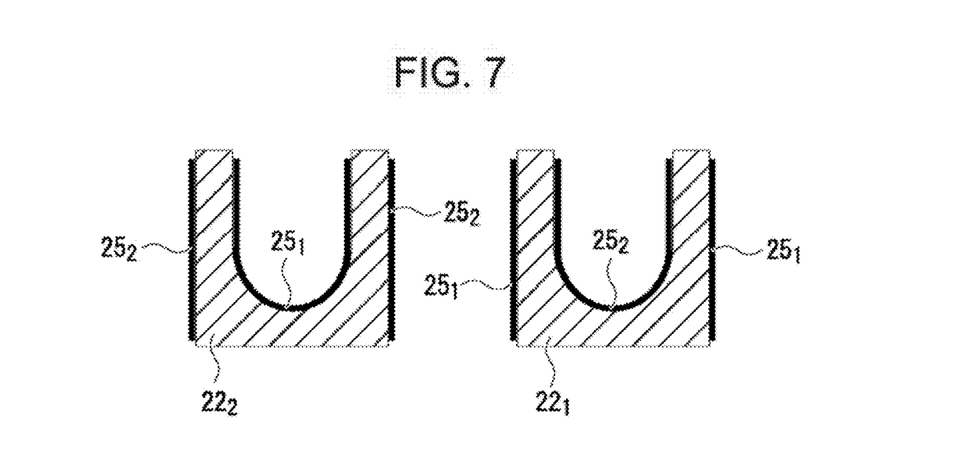
FIG. 7 is a sectional view for explaining another layout example of excitation electrodes.

However, as schematically illustrated in FIG. 7, it is preferable to make a groove in the specific surface of each vibrating arm 22 and to form the excitation electrode 25 inside the groove. The reason is that such structure can cause the CI (Crystal Impedance) value of the tuning fork vibrator 11 to lower, thereby improving the oscillation stability of the tuning fork vibrator 11.

Referring back to FIG. 4, the discussion on the tuning fork vibrator 11 will continuously proceed.

The above-mentioned first and second installation terminal $64_1$ and $64_2$ are respectively provided on the parts which faces the first terminal $26_1$ and the second terminal $26_2$ (see FIG. 5) when the tuning fork vibrating piece 20 is housed in the internal space 62 of the package 60.

And, the tuning fork vibrator 11 is configured by fixing the first tip part and the second tip part of the tuning fork vibrating piece 20 on the first installation terminal $64_1$ and the second installation terminal $64_2$ of the package 60 with the electrically conductive adhesive 68, respectively. Incidentally, the first tip part is, as already explained (defined), the part on which the first terminal $26_1$ of the first fixed arm $23_1$ is formed (the tip part of the undersurface of the first fixed arm $23_1$). Further, the second tip part is the part on which the first terminal $26_2$ of the second fixed arm $23_2$ is formed (the tip part of the undersurface of the first fixed arm $23_2$).

As described above, the tuning fork vibrator 11 according to the first embodiment has such structure that the ratio of length of the vibrating arm to the package size is larger than that of the conventional one. Therefore, it can be said that the tuning fork vibrator 11 according to the first embodiment is a tuning fork vibrator of which oscillation stability is approximately equal to that of the conventional one and which is smaller than the conventional one, a tuning fork vibrator which has a size approximately equal to that of the conventional one and of which oscillation stability is higher (CI value is smaller) than that of conventional one, or the like.

Figure 8:
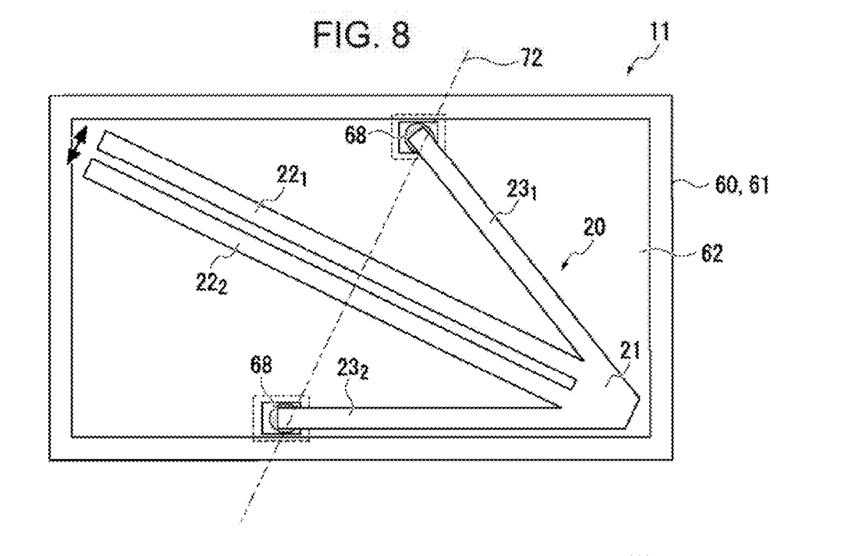
FIG. 8 is an explanatory diagram of a working effect related to the tuning fork vibrator according to the first embodiment.

Moreover, by adopting such structure that the tip parts of the two fixed arms 23 of the tuning fork vibrating piece 20, which extend obliquely from the base 21 so as to obliquely from the base 21 so as to interpose the two vibration arms 22, are fixed to the package, it is possible to prevent the tuning fork vibrating piece 20 from vibrating on the base 21 when an external force is applied. Further, by adopting such structure that the center of gravity of the tuning fork vibrating piece 20 is located on the center of two fixed points of the fixed arms 23, and the spacing between the fixed points becomes the largest, as schematically illustrated in FIG. 8, it is possible to lessen the displacement amount of the tip of each vibrating arm 22 at the time of external force being applied.

Consequently, by adopting the above-mentioned structure, it is possible to provide the tuning fork vibrator which has vibrating arms of approximately the same length as those of the conventional one, is smaller than the conventional one, and causes no trouble resulting from the oblique arrangement of the tuning fork vibrating piece.

Moreover, by adopting the above-mentioned structure, it is also possible to provide the tuning fork vibrator which has the same size as conventional ones and whose CI value is lower (oscillation stability is higher) by a value corresponding to an increment of the length of the vibrating arms. Specifically, in the existing 3215-size tuning fork vibrator, the tuning fork vibrating piece whose vibrating arm is about 2 mm in length is usually used. On the other hand, with the above-mentioned structure, the 3215-size tuning fork vibrator whose vibrating arm is about 2.9 mm in length, i.e., the 3215-size tuning fork vibrator having the CI value lower by a value corresponding to 0.9 mm, can be obtained.

Further, in the existing 2012-size tuning fork vibrator, the tuning fork vibrating piece whose vibrating arm is about 1.5 mm in length is usually used. When the above-mentioned structure is adopted, it is possible to provide the 2012-size tuning fork vibrator whose vibrating arm is about 1.73 mm in length, i.e., the 2012-size tuning fork vibrator whose CI value is lower than the conventional ones by a value corresponding 0.23 mm.

Finally, design procedure examples of the tuning fork vibrator 11 will be briefly explained.

The tuning fork vibrator 11 can be designed by various procedures. For instance, in a case where the shape of the package 60 is already determined, it is possible to design the tuning fork vibrating piece 20 in the first procedure described below.

To begin with, a process of determining the size of a square area in which the tuning fork vibrating piece is desirable to be placed, is performed. More specifically, performed is a process of specifying a square area (hereinafter referred to as a storage area) smaller than the mounting surface by an amount according to the error of attaching the tuning fork vibrating piece 20 to the bottom surface of the package 60, the permissible vibration amount of the vibrating arm 22 in the case where the external force is applied, etc. and then determining its size.

Next, the width (usually 200-300 micrometers) of the body part (the part consisting of the two vibrating arms 22 and the base 21) is determined. Then, based on the size of the storage area which has been already determined, the size of the longest rectangle that is inscribed in the storage area and has the determined width is determined. Moreover, the tilt angle of the rectangle to the storage area is determined.

Subsequently, the shapes of components (the base and the vibrating arms 22) of the body part are determined from the obtained size by taking into consideration the obtained tilt angle (the tilt angle of the longest rectangle having the determined width to the storage area). Note that the shape determined in this process is mainly the shape of the base 21 (the length of the base 21 in the front-back direction). Further, the reason why the tilt angle of the above-mentioned rectangle to the storage area is taken into consideration is because the length of the boundary portion between the fixed arms 23 and the body part (in other words, minimum length of the base 21) changes according to the tilt angle even if the width of the fixed arm 23 is the same.

After determining the shape of base 21 etc., the shape (length and tilt angle from the vibrating arm) of each fixed arm is determined so that the above condition is satisfied based on the tilt angle of the storage area of rectangle shape etc., thereby designing the tuning fork vibrating piece 20.

Further, in a case where the shape of the package 60 is already determined, it is also possible to design the tuning fork vibrating piece 20 in the second procedure described below. Note that the tuning fork vibrating piece 20 designed in the second procedure below becomes the one that has the vibrating arm 22 slightly shorter than that of the tuning fork vibrating piece 20 designed in the above-mentioned procedure.

First, same as in the case of designing the tuning fork vibrating piece 20 by the first procedure, the size of the storage area (the square area smaller than the base surface of the internal space 62 of the package 60 by an amount according to the attachment error etc.) is determined, and the width of the body part is determined.

Next, based on the size of the storage area, the size of the longest rectangle that is inscribed in the storage area, has the determined width, and has long sides parallel to the diagonal direction of the storage area, is determined. Subsequently, the shapes of components of the body part are determined from the determined size by taking into consideration the tilt angle of the diagonal direction of the storage area. Then, the tuning fork vibrating piece 20 is designed by determining the shape of each fixed arm 23 on the basis of the tilt angle etc.

Moreover, it is also possible to design the tuning fork vibrator 11 in the third procedure described below. Note that the tuning fork vibrating piece 20 designed in the second procedure below becomes the one that has the vibrating arm 22 slightly shorter than that of the tuning fork vibrating piece 20 designed in the above-mentioned procedure.

To begin with, the shape of the body part of the tuning fork vibrating piece 20 is determined. Subsequently, the package 60 which has the internal space 62 of minimum size in which the body part can be housed is designed by taking the attachment error etc. into consideration. Incidentally, the package 60 designed in this process is the one having the internal space 62 in which the body part is housed obliquely.

Then, after designing the package 60, the shape of each fixed arm 23 is designed from the tilt angle of the body part to the package 60 etc. using the procedure similar to the above-mentioned procedure, thereby designing the tuning fork vibrating piece 20.

Note that, from a viewpoint of matching the terminal positions (positions of the first terminal $26_1$ and the first installation terminal $64_1$, etc.), it is desirable to manufacture the package 60 by determining the position of each installation terminal 64 after determining the shape of the tuning fork vibrating piece 20. However, in a case where the shape of the tuning fork vibrating piece 20 is determined so that the plane 72 crosses the tip part of each fixed arm 23 and the spacing between the tip parts of the fixed arms 23 becomes the largest, even if the housed angle of the tuning fork vibrating piece 20 somewhat changes, the position of the tip part of each fixed arm 23 hardly changes. Consequently, it is possible to manufacture the package 60 before determining the shape of the tuning fork vibrating piece 20. Moreover, it is also possible to manufacture (assemble) the tuning fork vibrator 11 by combining the package 60 that is manufactured to the specific-shaped tuning fork vibrating pieces 20 with the other-shaped tuning fork vibrating piece 20.

Second Embodiment

Figure 9:
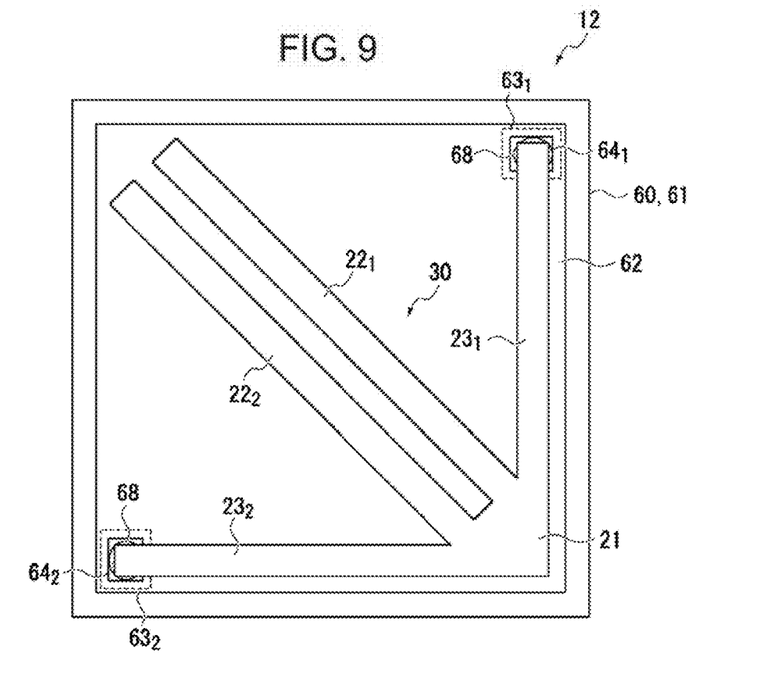
FIG. 9 is a schematic structural view of a tuning fork vibrator according to a second embodiment.

FIG. 9 illustrates schematic structure of the tuning fork vibrator 12 according to the second embodiment is shown.

The package 60 of this tuning fork vibrator 12 is a package equivalent to the package 60 for the tuning fork vibrator 12 which is deformed into the square shape (the right rectangular column shape).

The tuning fork vibrating piece 30 of the tuning fork vibrator 12 is the modified version of tuning fork vibrating piece 20 (FIG. 4) of the tuning fork vibrator 12 modified so as to be able to arrange on the mounting face having a square shape. In other words, the tuning fork vibrating piece 30 is a member that is designed by the second procedure on condition that the mounting face has a square shape.

Consequently, it can also be said that the tuning fork vibrator 12 according to the second embodiment is a tuning fork vibrator of which oscillation stability is approximately equal to that of the conventional ones and which is smaller than the conventional ones, a tuning fork vibrator which has a size approximately equal to that of the conventional ones and of which oscillation stability is higher than that of conventional ones, or the like.

Third Embodiment

Figure 10:
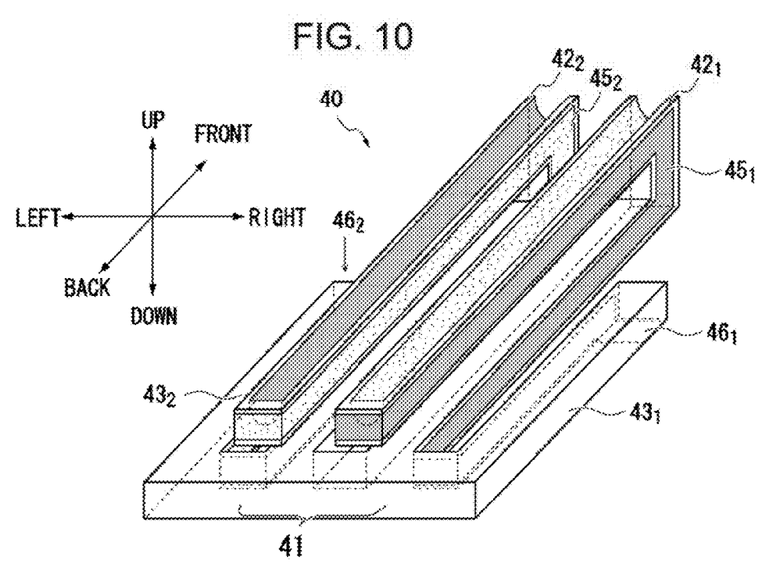
FIG. 10 is a perspective view of a tuning fork vibrating piece used in a tuning fork vibrator according to a third embodiment.

FIG. 10 illustrates structure of a tuning fork vibrating piece 40 used for the tuning fork vibrator according to the third embodiment. Note that, in the following discussion, front, back, left, right, up and down mean directions illustrated in FIG. 10.

As illustrated in FIG. 10, the tuning fork vibrating piece 40 used for the tuning fork vibrator according to the third embodiment includes a base 41 and two vibrating arms $42_1$ and $42_2$ extending in parallel from the base 41. Moreover, the tuning fork vibrating piece 40 includes a first fixed arm $43_1$ extending from the base 11 toward the right direction and then extending toward the front direction. The tuning fork vibrating piece 40 also includes a second fixed arm $43_2$ extending toward the front direction and then extending from the base 11 toward the left direction and then extending toward the front direction.

Each vibration arm 42 ($42_1$, $42_2$) has a U-shape that extends in the front direction, bents toward the up direction, and then extends in the back direction. Moreover, grooves (only parts of the grooves are illustrated in FIG. 10) are formed on the three outside surfaces (the uppermost surface, the lowermost surface and the surface which connects them in FIG. 10). Incidentally, this tuning fork vibrating piece 40 is manufactured, for example, so that the width (the length in the left-right direction) of each vibrating arm 42 becomes 80 micrometers, each of the width and depth of the groove of each vibrating arm 42 becomes 40 micrometers, and the spacing between the two vibrating arms 42 becomes 50-100 micrometers.

Two kinds of excitation electrodes $45_1$ and $45_2$ are formed on each surface of each vibrating arm 42. Note that, in FIG. 10 and in other figures such as FIG. 12, different patterns are attached to the excitation electrode $45_1$ and the excitation electrode $45_2$ not to indicate that constituent materials for the excitation electrodes 45 are different, but to make a layout (connection relationship) of each excitation electrode 45 intelligible.

On the tip part of the undersurface of the first fixed arm $43_1$ of the tuning fork vibrating piece 40, provided is a first terminal $46_1$ that is electrically connected with the excitation electrode $45_1$. On the tip part of the undersurface of the second fixed arm $43_2$ of the tuning fork vibrating piece 40, provided is a first terminal $46_2$ that is electrically connected with the excitation electrode $45_2$.

The tuning fork vibrating piece 40 has the structure explained above. And, the tuning fork vibrator according to the third embodiment is configured by housing the tuning fork vibrating piece 40 in the package so that the front-back direction of the tuning fork vibrating piece 40 coincides with the longitudinal direction of the package.

In short, the tuning fork vibrating piece 40 adapted to the tuning fork vibrator according to the fourth embodiment is the one each of whose vibrating arms 42 is bent in order to lengthen each vibrating arm 42 (the one including the vibrating arms 42 each having a U-shape).

The CI value becomes small as the oscillating arm becomes long. Consequently, use of the tuning fork vibrating piece 40 allows, for example, the 3215-size tuning fork vibrator whose CI value is small (oscillation instability is high) because the length of each vibrating arm 42 is about 4.0 mm (twice as long as the conventional vibrating arm). It is also possible to provide the 2012-size tuning fork vibrator whose CI value is small because the length of each vibrating arm 42 is about 3.0 mm.

Moreover, the tuning fork vibrating piece 40 has such structure that, when the length of each vibrating arm 42 is made into the same length as the conventional fork vibrating piece (FIGS. 1 and 2), its length in the front-back direction becomes half the length of the conventional fork vibrating piece.

Consequently, by adopting the structure of the tuning fork vibrator according to the present embodiment, it is possible to provide the tuning fork vibrator smaller than the conventional ones.

As described above, the tuning fork vibrating piece 40 has a shape more complicated than the general tuning fork vibrating piece. Therefore, a manufacturing procedure example of the tuning fork vibrating piece 40 will be explained briefly referring to FIGS. 11A-11G.

Figure 11A:
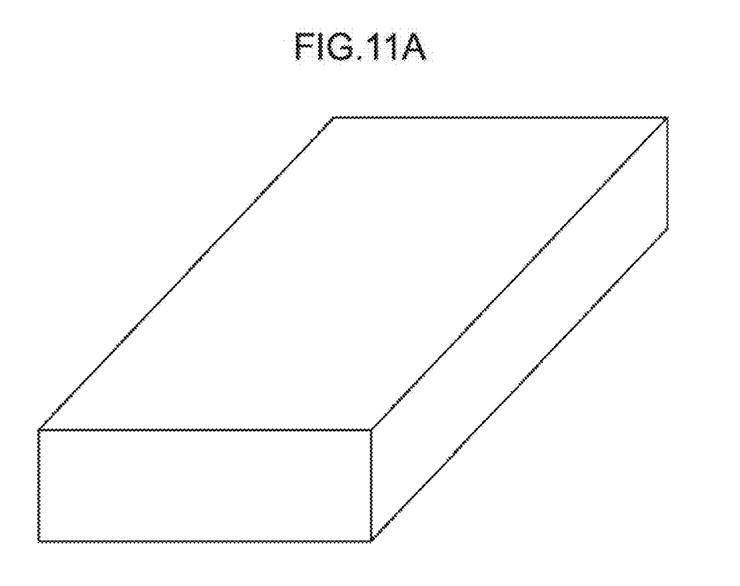
FIG. 11A is an explanatory diagram of a manufacturing procedure example of the tuning fork vibrating piece according to the third embodiment.
Figure 11B:
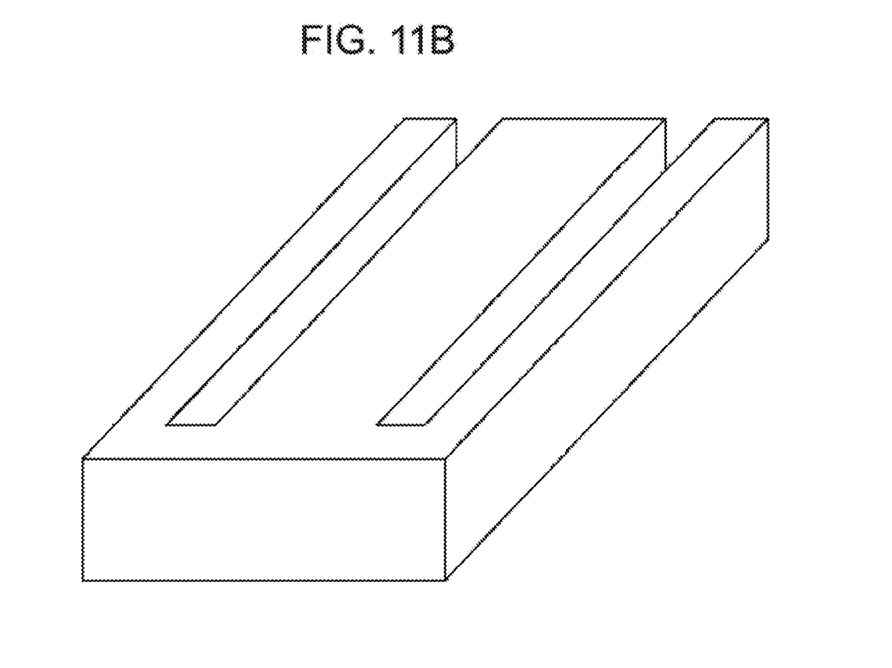
FIG. 11B is an explanatory diagram of the manufacturing procedure example of the tuning fork vibrating piece according to the third embodiment.
Figure 11C:
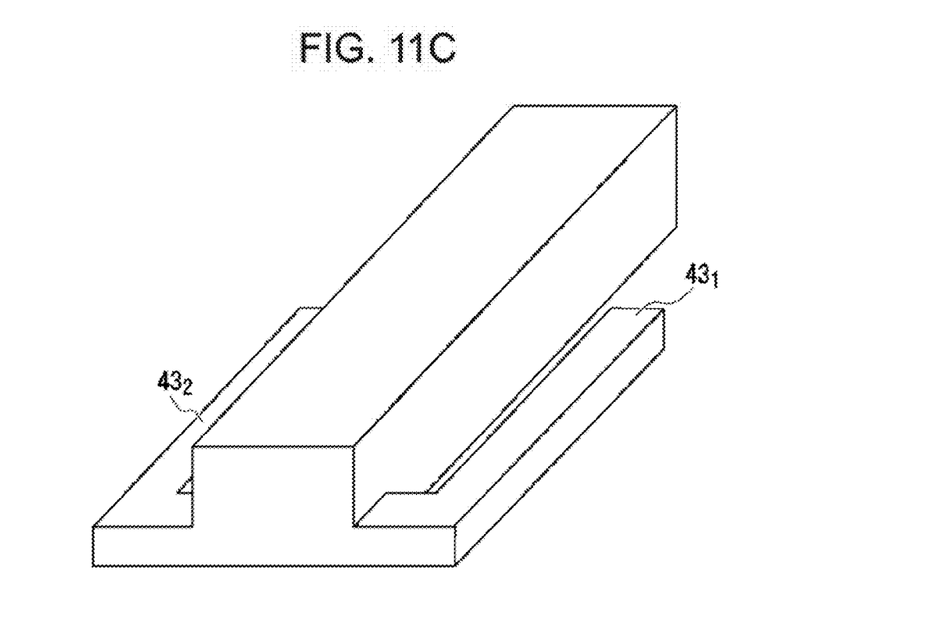
FIG. 11C is an explanatory diagram of the manufacturing procedure example of the tuning fork vibrating piece according to the third embodiment.

At the time of manufacturing the tuning fork vibrating piece 40, a first, a quartz crystal (FIG. 11A) of which the length of respective side is almost the same as the tuning fork vibrating piece 40 to be manufactured is prepared. Then, a member having a shape illustrated in FIG. 11B is obtained by etching the quartz crystal from above (or below). Next, the first fixed arm $43_1$ and the second fixed arm $43_2$ are formed by processing (polishing etc.) the right and left portions of the member (FIG. 11C).

Figure 11D:
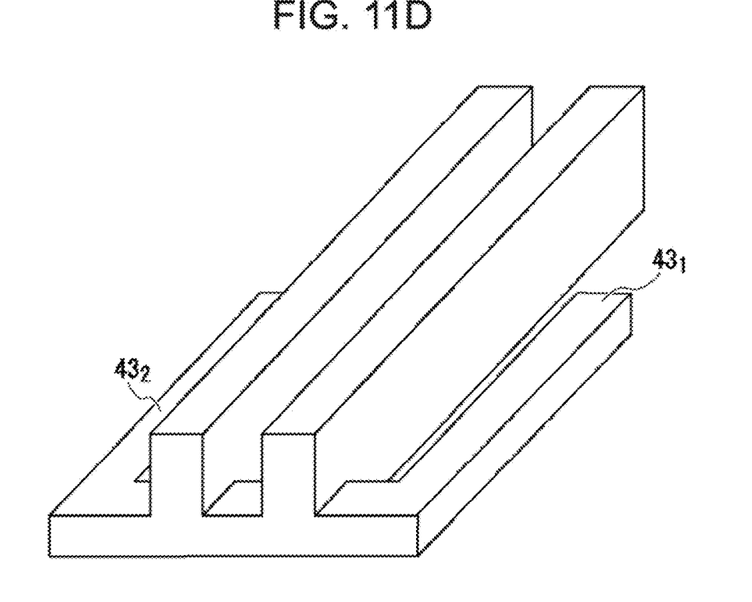
FIG. 11D is an explanatory diagram of the manufacturing procedure example of the tuning fork vibrating piece according to the third embodiment.

Subsequently, a member having a shape illustrated in FIG. 11D is obtained by etching from above the member in which the fixed arms 43 are formed. Then, vibrating arms $42_1$ and $42_2$ having no groove (FIG. 11E) are formed by etching the member from the side directions (right and left side directions).

Figure 11E:
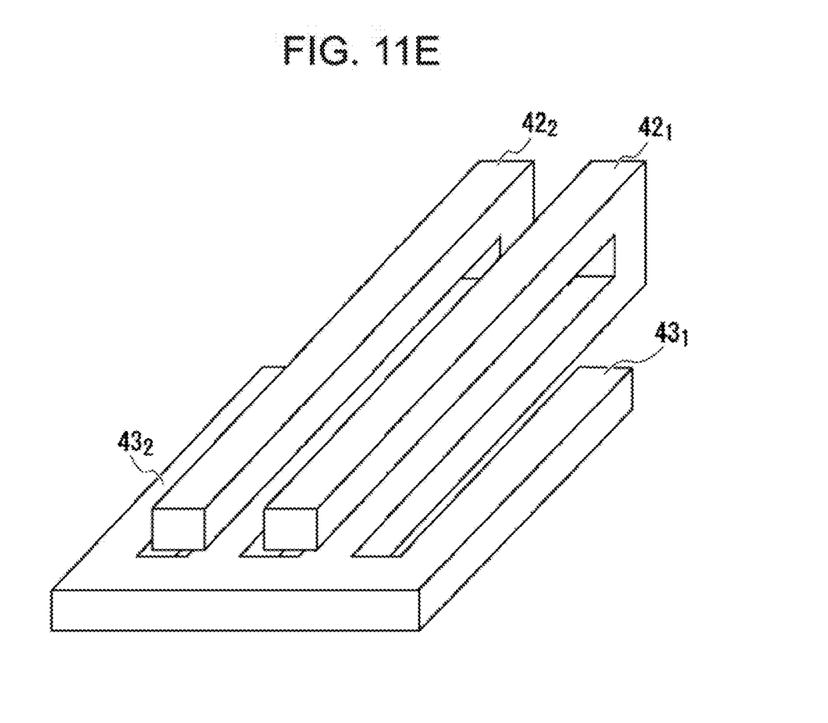
FIG. 11E is an explanatory diagram of the manufacturing procedure example of the tuning fork vibrating piece according to the third embodiment.
Figure 11F:
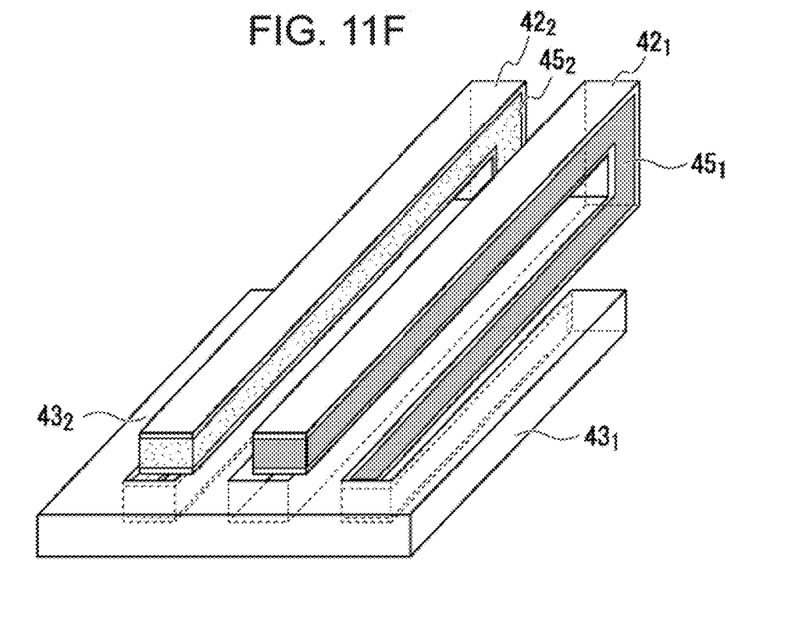
FIG. 11F is an explanatory diagram of the manufacturing procedure example of the tuning fork vibrating piece according to the third embodiment.
Figure 11G:
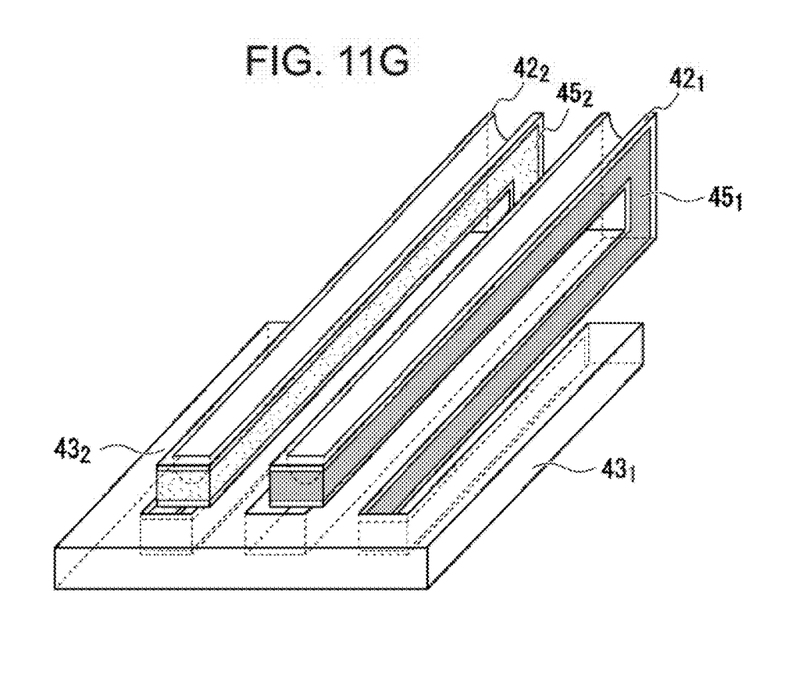
FIG. 11G is an explanatory diagram of the manufacturing procedure example of the tuning fork vibrating piece according to the third embodiment.

After that, electrode (a part of excitation electrodes 45) is formed on each surface of the member depicted in FIG. 11E by sputtering etc. (FIG. 11F), and grooves are formed on the three outer surface of each vibrating arm 42 (FIG. 11G).

Then, the tuning fork vibrating piece 40 (FIG. 10) is manufactured by forming electrodes (parts of the excitation electrodes 45, the first terminal $46_1$, the second terminal $46_2$) within the formed grooves and on the tip part of the undersurface of each fixed arm 43.

Fourth Embodiment

Figure 12:
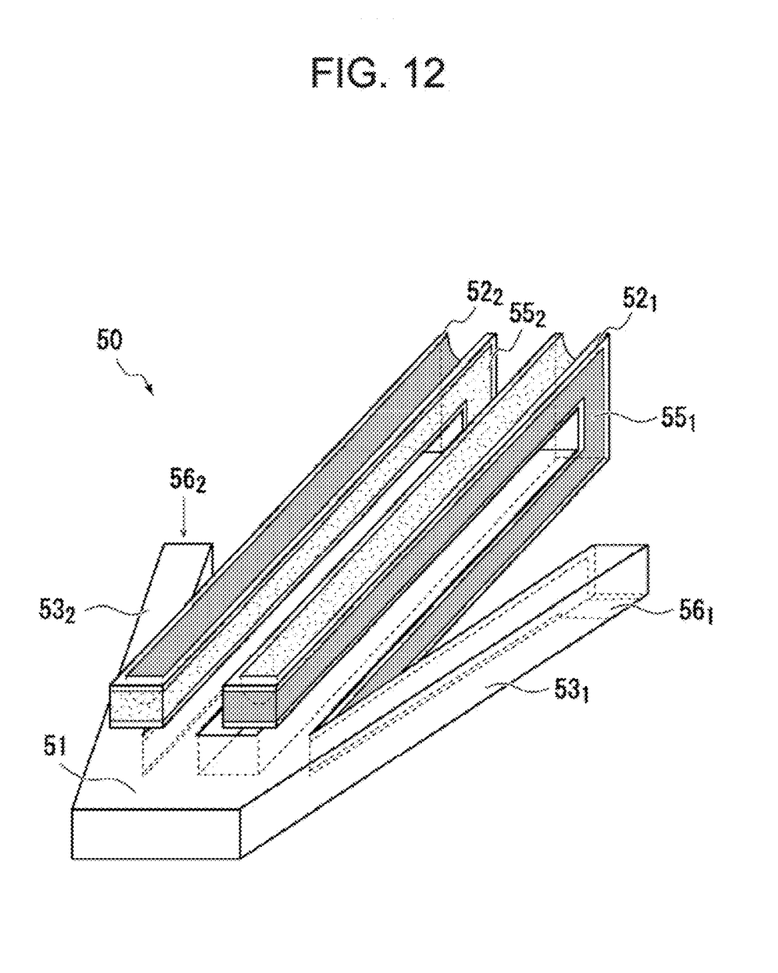
FIG. 12 is a perspective view of the tuning fork vibrating piece used in a tuning fork vibrator according to the fourth embodiment.

FIG. 12 illustrates structure of the tuning fork vibrating piece 50 used for the tuning fork vibrator according to the fourth embodiment. Note that, similarly to in FIG. 10 etc., in FIG. 12, different patterns are attached to the excitation electrode $55_1$ and the excitation electrode $55_2$ in order to make a layout of each excitation electrode 55 intelligible.

As depicted in FIG. 12, a tuning fork vibrating piece 50 used for a tuning fork vibrator according to the fourth embodiment includes a base 51 and two vibrating arms $52_1$ and $52_2$ extending in parallel from the base 51. Further, the tuning fork vibrating piece 50 also includes a first fixed arm $53_1$ and a second fixed arm $53_2$ extending obliquely from the base 51 so as to interpose the two vibrating arms 52 ($52_1$ and $52_2$).

Grooves (only parts of the grooves are illustrated in FIG. 11) are formed on the three outside surfaces (the uppermost surface, the lowermost surface and the surface which connects them in FIG. 11), and two kinds of excitation electrodes $55_1$ and $55_2$ are formed on each surface of each vibrating arm 52.

On the tip part of the undersurface of the first fixed arm $53_1$ of the tuning fork vibrating piece 50, provided is a first terminal $56_1$ that is electrically connected with the excitation electrode $55_1$. On the tip part of the undersurface of the second fixed arm $53_2$, provided is a first terminal $46_2$ that is electrically connected with the excitation electrode $55_2$.

And, the tuning fork vibrator according to the present embodiment is configured by housing and fixing the tuning fork vibrating piece 50 in the package having the same structure as the package 60 (FIG. 4) for the tuning fork vibrator 11 according to the first embodiment using a housing and fixing method similar to that for the tuning fork vibrator 20.

As obvious from the discussion given above, the tuning fork vibrator according to the fourth embodiment exerts the action effect of the tuning fork vibrator 20 according to the first embodiment and the action effect of the tuning fork vibrator according to the third embodiment.

Consequently, by adopting the structure of the tuning fork vibrator according to the present embodiment, it is possible to provide a tuning fork vibrator which has a size approximately equal to that of the conventional ones and of which oscillation stability is very high, a tuning fork vibrator of which oscillation stability is approximately equal to that of the conventional ones and which is very small, or the like.

Modified Examples

The tuning fork vibrator according to each of the above-mentioned embodiments can be modified in a variety of forms. For instance, the tuning fork vibrator according to the first, second or fourth embodiment can be modified into the one including the tuning fork vibrating piece having the first, second fixed arms whose length and/or extending angle (angle from the vibrating arm) are(is) different from those of the embodiment. However, it is preferable to configure the tuning fork vibrator to have such a shape that a plane that passes through the center of gravity of the tuning fork vibrating piece and is perpendicular to the extending direction crosses the tip part of the first fixed arm and the tip part of the second fixed arm in order to be able to reduce the amount of vibrations at the time of external force being added. Note that an example of the tuning fork vibrator that satisfies above condition is the one having the tuning fork vibrating peace 20 whose first fixed arm $21_1$ and second fixed arm $21_2$ are respectively extended to the top right corner and the top-left corner in FIG. 4.

The tuning fork vibrator according to the first, second or fourth embodiment can also be modified into the one including the tuning fork vibrating piece that dose not have the first and second terminal provided on the tip parts of the fixed arms (the one including the tuning fork vibrating piece having the fixed arms each having tip part that is fixed to the package but is not used for electric connection). Moreover, it is taken for granted that the constituent material for the tuning fork vibrating piece may not be a quartz crystal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments) of the present invention have been described in detail, it should be understood that the various changes, substitutions, and alterations could be made hereto without departing from the spirit and scope of the invention.

What is claimed is:
1. A tuning fork vibrator, comprising:
a package having an internal space having a rectangle column shape;
a tuning fork vibration piece including a base, two vibration arms extending in parallel form the base and a first arm and a second arm extending obliquely from the base so as to interpose the two vibration arms, the tuning fork vibration piece having a length from the base to a tip in an extended direction of the two vibration arms which is longer than each side of the bottom surface of the internal space,
wherein the tuning fork vibration piece is placed in the internal space with the extended direction set along a diagonal direction of the internal space, and a tip part of the first arm and a tip part of the second arm of the tuning fork vibration piece are fixed to the bottom surface of the internal space.

2. The tuning fork vibrator according to claim 1, wherein the tuning fork vibrating piece includes:
a first excitation electrode and a second excitation electrode that are respectively provided on the two vibrating arms, respectively;
a first terminal that is provided on an undersurface of the tip part of the first fixed arm and is electrically connected to the first excitation electrode; and
a second terminal that is provided on an undersurface of the tip part of the second fixed arm and is electrically connected to the second excitation electrode,
the package includes:
a first mounting terminal and a second mounting terminal that are provided on an external surface of the package;
a first installation terminal that is electrically connected to the first excitation electrode and is provided on a part of the bottom face, which faces the first terminal when the tuning fork vibrating piece is placed in the internal space; and
a second installation terminal that is electrically connected to the second excitation electrode and is provided on a part of the bottom face, which faces the second terminal when the tuning fork vibrating piece is placed in the internal space, and
the undersurface of the tip part of the first fixed arm and the undersurface of the tip part of the second fixed arm are fixed to the first installation terminal and the second installation terminal by a electrically conductive adhesive, respectively.

3. The tuning fork vibrator according to claim 1, wherein the tuning fork vibrating piece has such a shape that a plane that passes through the center of gravity of the tuning fork vibrating piece and is perpendicular to the extending direction crosses the tip part of the first fixed arm and the tip part of the second fixed arm.

4. The tuning fork vibrator according to claim 1, wherein the tuning fork vibrating piece have a plane symmetrical shape with respect to a plane positioned at the center of the two vibrating arms.

5. The tuning fork vibrator according to claim 1, wherein a groove is formed in one surface of each vibrating arm of the tuning fork vibrating piece, and an excitation electrode is formed inside the groove of each vibrating arm of the tuning fork vibrating piece.

6. A tuning fork vibrator, comprising:
a package; and
a tuning fork vibrating piece that is placed in the package and includes a base, two vibration arms extending in parallel form the base, and two fixed arms extending obliquely from the base so as to interpose the two vibration arms,
wherein each of the two vibration arms of the tuning fork vibrating piece has a U-shape that extends in a specific direction, bents toward a direction separating from a mounting surface of the tuning fork vibrating piece onto the package, and then extends in a direction opposite to the specific direction.

7. The tuning fork vibrator according to claim 6, wherein the tuning fork vibrating piece has such a shape that each of the two fixed arms extends obliquely from the base and a length in an extended direction of the two vibration arms is longer than each side of a bottom surface of an internal space of the package,
the tuning fork vibration piece is placed in the internal space of the package with the extended direction set along a diagonal direction of the internal space, and
a tip part of each of the two fixed arms of the tuning fork vibration piece is fixed to the bottom surface of the internal space.

* * * * *